United States Patent
Lee et al.

(10) Patent No.: US 9,552,891 B2
(45) Date of Patent: Jan. 24, 2017

(54) INTEGRATED DRIVING APPARATUS INCLUDING STAGES DRIVING DISPLAY PANEL

(75) Inventors: Jae Hoon Lee, Seoul (KR); Whee-Won Lee, Busan (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 415 days.

(21) Appl. No.: 13/331,360

(22) Filed: Dec. 20, 2011

(65) Prior Publication Data

US 2013/0027378 A1     Jan. 31, 2013

(30) Foreign Application Priority Data

Jul. 25, 2011 (KR) .................... 10-2011-0073539

(51) Int. Cl.
 *G09G 3/36* (2006.01)
 *G11C 19/28* (2006.01)

(52) U.S. Cl.
 CPC ............. *G11C 19/28* (2013.01); *G09G 3/3677* (2013.01); *G09G 2310/0286* (2013.01)

(58) Field of Classification Search
 CPC ....................... G09G 3/3611; G09G 2310/0286
 USPC ............ 345/55, 87, 98–100; 326/62, 63, 80; 327/333, 379
 See application file for complete search history.

(56) References Cited

U.S. PATENT DOCUMENTS

| | | | |
|---|---|---|---|
| 6,829,322 B2 * | 12/2004 | Shih ...................... | G11C 19/28 345/100 |
| 2007/0127620 A1 * | 6/2007 | Moon et al. ..................... | 377/64 |
| 2007/0217564 A1 * | 9/2007 | Tobita .................... | G11C 19/28 377/64 |
| 2008/0036725 A1 * | 2/2008 | Lee et al. ....................... | 345/100 |
| 2008/0100560 A1 | 5/2008 | Na et al. | |
| 2008/0136756 A1 | 6/2008 | Yeo et al. | |
| 2010/0039363 A1 | 2/2010 | Lee et al. | |
| 2010/0295829 A1 | 11/2010 | Kwon et al. | |

FOREIGN PATENT DOCUMENTS

| | | |
|---|---|---|
| JP | 2005151577 | 6/2005 |
| JP | 2010107966 | 5/2010 |
| JP | 4623526 | 11/2010 |
| KR | 1020080019116 | 3/2008 |
| KR | 1020080040847 | 5/2008 |
| KR | 1020080099960 | 11/2008 |
| KR | 1020090085235 | 8/2009 |
| KR | 1020100021234 | 2/2010 |
| KR | 1020100094613 | 8/2010 |

* cited by examiner

*Primary Examiner* — Ram Mistry
(74) *Attorney, Agent, or Firm* — Cantor Colburn LLP

(57) ABSTRACT

A display panel includes: gate and data lines; pixels connected to the gate and data lines; and a stage includes: a pull-up driver including an output terminal of the stage and which outputs a gate-on voltage, an output pull-down unit which pulls down an output terminal of the stage, a reset unit which changes a voltage of a second node into a low voltage based on a voltage of the output terminal of the stage, a first node pull-up unit which changes a first node into a high voltage based on a gate-on voltage from a previous stage, a first node pull-down unit which changes the first node into the low voltage based on the gate-on voltage from a subsequent stage, and a first node reset unit which changes the voltage of the first node into the low voltage based on the voltage of the second node.

20 Claims, 9 Drawing Sheets

INTEGRATED DRIVING APPARATUS INCLUDING STAGES DRIVING DISPLAY PANEL

This application claims priority to Korean Patent Application No. 10-2011-0073539, filed on Jul. 25, 2011, and all the benefits accruing therefrom under 35 U.S.C. §119, the content of which in its entirety is herein incorporated by reference.

BACKGROUND OF THE INVENTION (a) Field of the Invention

Exemplary embodiments of the invention relate to a display panel and an integrated driving apparatus on the display panel.

(b) Description of the Related Art

A liquid crystal display ("LCD") is one of the most widely used types of flat panel display, and the LCD typically includes two display panels, on which field-generating electrodes, such as a pixel electrode and a common electrode, are provided, and a liquid crystal layer disposed therebetween. The LCD displays images by applying voltages to the field-generating electrodes to generate an electric field in a liquid crystal ("LC") layer that determines the orientations of LC molecules therein to adjust polarization of incident light. In general, a display device includes an organic light emitting device, a plasma display device and an electrophoretic display, in addition to the liquid crystal display.

The display device typically includes a gate driver and a data driver. In the display device, the gate driver may be integrated in a panel and patterned together with other parts, e.g., a gate line, a data line and a thin film transistor. When the gate driver is integrated in the pale with the other parts, the display device does not include an additional gate driving chip, and the manufacturing costs thereof may be reduced.

However, the integrated gate driver may have a characteristic of a semiconductor (particularly, an amorphous semiconductor) of a thin film transistor that is changed according to temperature. As a result, a gate voltage output at a high temperature may have an inconstant waveform and noise may be generated, and the thin film transistor may abnormally operate at a low temperature.

Also, in the integrated gate driver, a leakage current is generated by a ripple in the thin film transistor, and thus an output characteristic of the gate driver may be deteriorated.

In addition, when the gate driver is integrated, it is difficult to reduce the size of a non-display area at the outer part of the display panel.

BRIEF SUMMARY OF THE INVENTION

Exemplary embodiments of the invention provide an integrated driving apparatus for a display panel, and, more particularly, a display device or a driving apparatus without an error due to an inner leakage current and a temperature change for a driving apparatus, and having a small integrated area.

In an exemplary embodiment, a display panel includes: a plurality of gate lines; a plurality of data lines crossing the plurality of gate lines; a plurality of pixels connected to the plurality of gate lines and the plurality of data lines; and a plurality of stages respectively connected to the plurality of gate lines and an integrated gate driver, wherein each of the plurality of stages includes: a first node, a second node, a pull-up driver including an output terminal of the each of the plurality of stages, connected to the first node, and which outputs a gate-on voltage, an output pull-down unit connected to the second node and which pulls down an output terminal of the each of the plurality of stages, a reset unit connected to the second node and which changes a voltage of the second node into a low voltage based on a voltage of the output terminal of the each of the plurality of stages, a first node pull-up unit connected to the first node and which changes the first node into a high voltage based on a gate-on voltage output from a previous stage of the each of the plurality of stages, a first node pull-down unit connected to the first node and which changes the first node into the low voltage based on the gate-on voltage output from a subsequent stage of the each of the plurality of stages, and a first node reset unit connected to the first node and which changes the voltage of the first node into the low voltage based on the voltage of the second node.

In an exemplary embodiment, the reset unit may include a first transistor and a second transistor, the first transistor of the reset unit may include a control terminal connected to the output terminal, an input terminal connected to the second node, and an output terminal connected to the second transistor of the reset unit, and the second transistor of the reset unit may include a control terminal connected to the output terminal of the each of the plurality of stages, an input terminal connected to the first transistor of the reset unit, and an output terminal connected to a voltage input terminal of the each of the plurality of stages to receive a low voltage.

In an exemplary embodiment, the reset unit may include a transistor, and the transistor of the reset unit may include a control terminal connected to the output terminal of the each of the plurality of stages, an input terminal connected to the second node, and an output terminal connected to a voltage input terminal to receive a low voltage.

In an exemplary embodiment, the pull-up driver may include a transistor and a capacitor, the transistor of the pull-up driver may include a control terminal connected to the first node, an input terminal connected to a first clock input terminal, and an output terminal connected to the output terminal of the each of the plurality of stages, and the capacitor of the pull-up driver may be connected to the control terminal and the output terminal of the transistor of the pull-up driver.

In an exemplary embodiment, the output pull-down unit may include a first transistor and a second transistor, the first transistor of the output pull-down unit may include a control terminal connected to the second node, an input terminal connected to the output terminal of the each of the plurality of stages, and an output terminal connected to an voltage input terminal to receive a low voltage, and the second transistor may include a control terminal connected to a second clock input terminal, an input terminal connected to the output terminal of the each of the plurality of stages, and an output terminal connected to a voltage input terminal to receive a low voltage.

In an exemplary embodiment, the first node pull-up unit may include a first transistor and a second transistor, the first node reset unit may include a first transistor and a second transistor, the first transistor of the first node pull-up unit may include a control terminal connected to a first input terminal of the each of the plurality of stages, an input terminal connected to a first direct current ("DC") voltage terminal of the each of the plurality of stages, and an output terminal connected to a third node of the each of the plurality of stages, the second transistor of the first node pull-up unit may include a control terminal connected to the first input terminal of the each of the plurality of stages, an input terminal connected to an output terminal of the first transistor of the first node pull-up unit, and an output terminal connected to the first node, the first transistor of the first node reset unit may include a control terminal connected to a second input terminal of the each of the plurality of stages, an input terminal connected to the first node, and an output terminal connected to the third node, and the second transistor of the first node reset unit may include a control terminal connected to the second input terminal of the each of the plurality of stages, an input terminal connected to an output terminal of the first transistor of the first node reset unit, and an output terminal connected to a second DC voltage terminal of the each of the plurality of stages.

In an exemplary embodiment, the first node pull-down unit may include a first transistor and a second transistor, the first transistor of the first node pull-down unit may include a control terminal connected to the second node, an input terminal connected to the third node, and an output terminal connected to a voltage input terminal to receive a low voltage, and the second transistor of the first node pull-down unit may include a control terminal connected to the second node, an input terminal connected to the first node, and an output terminal connected to the input terminal of the first transistor of the first node pull-down unit.

In an exemplary embodiment, the first node pull-up unit may include a transistor, the first node reset unit may include a transistor, the transistor of the first node pull-up unit may include a control terminal connected to the first input terminal, an input terminal connected to a first DC voltage terminal, and an output terminal connected to the first node, and the transistor of the first node reset unit may include a control terminal connected to the second input terminal, an input terminal connected to the first node, and an output terminal connected to a second DC voltage terminal.

In an exemplary embodiment, the first node pull-down unit may include a transistor, and the transistor of the first node pull-down unit may include a control terminal connected to the second node, an input terminal connected to the first node, and an output terminal connected to the voltage input terminal to receive a low voltage.

In an exemplary embodiment, the each of the plurality of stages may further include a floating node stabilization unit which transmits a gate-on voltage to a third node of the each of the plurality of stages, and the third node may be connected to the floating node stabilization unit, the first node pull-up unit, the first node reset unit and the first node pull-down unit.

In an exemplary embodiment, the each of the plurality of stages may include a first DC voltage terminal which is applied with a high voltage and a second DC voltage terminal which is applied with a low voltage in a forward direction mode, the first DC voltage terminal may be connected to the first node pull-up unit, and the second DC voltage terminal may be connected to the first node reset unit.

In an exemplary embodiment, the first DC voltage terminal may be applied with the low voltage and the second DC voltage terminal may be applied with the high voltage in a reverse direction mode, an operation of the first node pull-up unit in the reverse direction mode may be substantially the same as an operation of the first node reset unit in the forward direction mode, and an operation of the first node reset unit in the reverse direction mode may be substantially the same as an operation of the first node pull-up unit in the forward direction mode.

In another exemplary embodiment, a driving apparatus integrated with a display panel includes a gate driver including a plurality of stages which transmits a gate-on voltage to a plurality of gate lines, where each of the plurality of stages includes: a first node; a second node; a pull-up driver including an output terminal of the each of the plurality of stages, connected to the first node, and which outputs a gate-on voltage; an output pull-down unit connected to the second node and which pulls down the output terminal of the each of the plurality of stages; a reset unit connected to the second node and which changes a voltage of the second node into a low voltage based on a voltage of the output terminal of the each of the plurality of stages; a first node pull-up unit connected to the first node and which changes the first node into a high voltage based on a gate-on voltage output from a previous stage of the each of the plurality of stages; a first node pull-down unit connected to the first node and which changes the first node into a low voltage based on the gate-on voltage output from a subsequent stage of the each of the plurality of stages; and a first node reset unit connected to the first node and which changes the voltage of the first node into a low voltage based on the voltage of the second node.

In an exemplary embodiment, the reset unit may include a first transistor and a second transistor, the first transistor of the reset unit may include a control terminal connected to the output terminal of the pull-up driver, an input terminal connected to the second node, and an output terminal connected to the second transistor of the reset unit, and the second transistor of the rest unit may include a control terminal connected to the output terminal of the pull-up driver, an input terminal connected to the first transistor of the reset unit, and an output terminal connected to a voltage input terminal to receive a low voltage.

In an exemplary embodiment, the reset unit may include a transistor, and the transistor of the reset unit may include a control terminal connected to an output terminal, an input terminal connected to the second node, and the output terminal connected to a voltage input terminal to receive a low voltage.

In an exemplary embodiment, the first node pull-up unit may include a first transistor and a second transistor, the first node reset unit may include a first transistor and a second transistor, the first transistor of the first node pull-up unit may include a control terminal connected to a first input terminal, an input terminal connected to a first DC voltage terminal, and an output terminal connected to a third node of the each of the plurality of stages, the second transistor of the first node pull-up unit may include a control terminal connected to the first input terminal, an input terminal connected an output terminal of the first transistor of the first node pull-up unit, and an output terminal connected to the first node, the first transistor of the first node rest unit may include a control terminal connected to a second input terminal, an input terminal connected to the first node, and an output terminal connected to the third node, and the second transistor of the first node reset unit may include a control terminal connected to the second input terminal, an input terminal connected to an output terminal of the first transistor of the first node rest unit, and the output terminal connected to a second DC voltage terminal.

In an exemplary embodiment, the first node pull-down unit may include a first transistor and a second transistor, the first transistor of the first node pull-down unit may include a control terminal connected to the second node, an input terminal connected to the third node, and an output terminal connected to a voltage input terminal to receive a low voltage, and the second transistor of the first node pull-down unit may include a control terminal connected to the second node, an input terminal connected to the first node, and an output terminal connected to the input terminal of the first transistor of the first node pull-down unit.

In an exemplary embodiment, the first node pull-up unit may include a transistor, the first node reset unit may include a transistor, the transistor of the first node pull-up unit may include a control terminal connected to a first input terminal, an input terminal connected to a first DC voltage terminal, and an output terminal connected to the first node, and the transistor of the first node reset unit may include a control terminal connected to a second input terminal, an input terminal connected to the first node, and an output terminal connected to a second DC voltage terminal.

In an exemplary embodiment, the first node pull-down unit may include a transistor, and the transistor of the first node pull-down unit may include a control terminal connected to the second node, an input terminal connected to the first node, and an output terminal connected to a voltage input terminal to receive a low voltage.

In an exemplary embodiment, the each of the plurality of stages may further include a floating node stabilization unit which transmits a gate-on voltage to a third node of the each of the plurality of stages, and the third node may be connected to the floating node stabilization unit, the first node pull-up unit, the first node reset unit and the first node pull-down unit.

In exemplary embodiments, the each of the plurality of stages may include the pull-up driver, the output pull-down unit, the reset unit, the first node pull-up unit, the first node pull-down unit, and the first node reset unit to integrate the gate driver with the panel such that the manufacturing cost may be substantially reduced.

In an exemplary embodiment, a node inside the pull-up driver is used as a control node of the reset unit such that the gate driver may be stably operated at a high temperature. In an exemplary embodiment, the reset unit may include only one transistor such that the gate driver may be stably operated at a low temperature.

In an exemplary embodiment, at least one unit in the stage includes one transistor instead of two transistors such that the area where the gate driver is integrated may be substantially reduced.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION OF THE INVENTION

Figure 1:
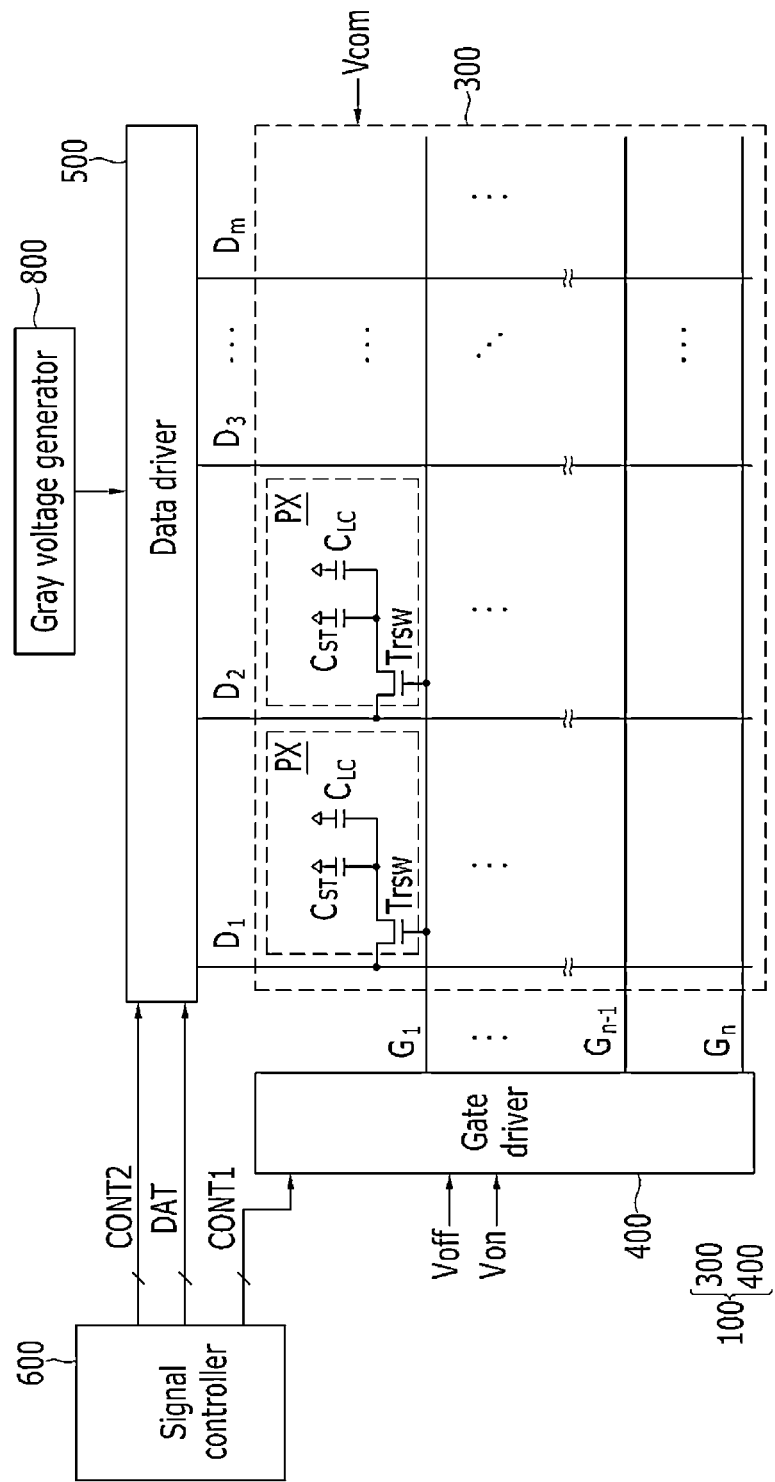
FIG. 1 is a block diagram showing an exemplary embodiment of a display device according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, an exemplary embodiment of a display device according to the invention will be described with reference to FIG. 1.

FIG. 1 is a block diagram showing an exemplary embodiment of a display device according to the invention.

Referring to FIG. 1, the display panel 100 includes a display area 300 that displays an image, and a gate driver 400 that applies a gate voltage to a gate line of the display area 300. In an exemplary embodiment, the gate driver 400 is integrated with the display panel 100.

A data line of the display area 300 is applied with a data voltage from a data driver 500, which may be provided on a flexible printed circuit ("FPC") film attached to the display panel 100.

The gate driver 400 and the data driver 500 are controlled by a signal controller 600.

A printed circuit board ("PCB") is disposed outside the FPC film to transmit a signal from the signal controller 600 to the data driver 500 and the gate driver 400. A signal provided from the signal controller 600 includes signals such as a first clock signal CKV, a second clock signal CKVB, a scan start signal STVP, and signals that provides predetermined voltages Vss, Vcom, Vcst, DIR and DIRB.

The display area 300 includes pixels PX arranged substantially in a matrix form, for example, as shown in a liquid crystal panel of FIG. 1. In an exemplary embodiment, the display may be an organic light emitting panel including a thin film transistor and an organic light emitting diode. In an exemplary embodiment, the display panel may be other types of display panel, which include an element, such as a thin film transistor, forming the display area 300. Hereinafter, an exemplary embodiment, where the display panel is a liquid crystal panel, will be described.

The display area 300 includes a plurality of gate lines G1 to Gn and a plurality of data lines D1 to Dm, and the gate lines G1 to Gn and the data lines D1 to Dm are insulated from and intersect each other.

Each of the pixels PX includes a thin film transistor Trsw, a liquid crystal capacitor Clc and a storage capacitor Cst. A control terminal of the thin film transistor Trsw is connected to one gate line, an input terminal of the thin film transistor Trsw is connected to one data line, and an output terminal of the thin film transistor Trsw is connected to one terminal of the liquid crystal capacitor Clc and one terminal of the storage capacitor Cst. The other terminal of the liquid crystal capacitor Clc is connected to a common electrode, and the other terminal of the storage capacitor Cst is applied with a storage voltage applied from the signal controller 600.

The data lines D1 to Dm receive the data voltage from the data driver 500, and the gate lines G1 to Gn receive the gate voltage from the gate driver 400.

The data driver 500 is connected to the data lines D1 to Dm at an upper or lower side of the display panel 100 and extending substantially in a vertical direction, and the data driver 500 selects a corresponding data voltage among gray voltages generated in a gray voltage generator 800 and applies the corresponding data voltage to the data lines D1 to Dm.

The gate driver 400 alternately applies the gate-on voltage and the gate-off voltage to the gate lines G1 to Gn. In such an embodiment, the gate-on voltage is sequentially applied to the gate lines G1 to Gn.

The gate driver 400 receives the first and second clock signals CKV and CKVB, the scan start signal STVP, a low voltage Vss corresponding to the gate-off voltage, and a pair of direct current ("DC") voltages DIR and DIRB to generate the gate voltages (the gate-on voltage and the gate-off voltage), and sequentially applies the gate-on voltage to the gate lines G1 to Gn.

Hereinafter, the gate driver 400 and the gate lines G1 to Gn of an exemplary embodiment of the invention will be described in greater detail.

Figure 2:
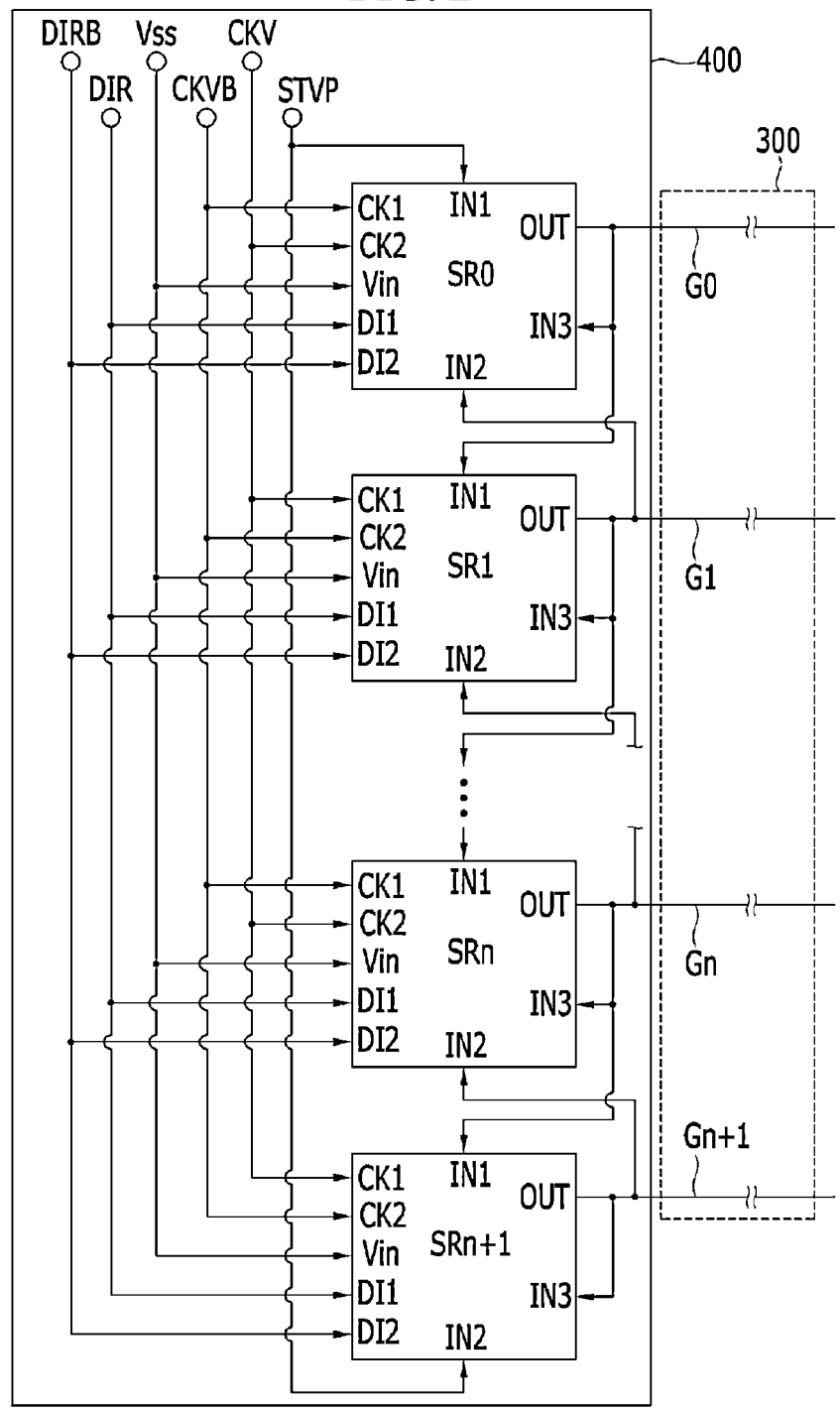
FIG. 2 is a block diagram showing an exemplary embodiment of a gate driver and a gate line according to the invention.

FIG. 2 is a block diagram showing an exemplary embodiment of a gate driver and a gate line according to the invention.

In FIG. 2, the number of gate lines in the display area 300 of an exemplary embodiment of the display panel 100 is n, and two dummy gate lines are provided at the periphery of the display area 300. In such an embodiment, the total number of the gate lines is n+2. In such an embodiment, a 0-th gate line G0 is provided before a first gate line G1, and an (n+1)-th gate line G(n+1) is provided after an n-th gate line Gn. In an alternative exemplary embodiment, the number of the dummy gate lines may vary, e.g., may be one or more than two.

In an exemplary embodiment, the gate driver 400 includes a plurality of stages SR0 to SR(n+1) dependently connected to each other. Each of the stages SR0 to SR(n+1) includes three input terminals, e.g., a first input terminal IN1, a second input terminal IN2 and a third input terminal IN3, two clock input terminals, e.g., a first clock input terminal CK1 and a second clock input terminal CK2, a voltage input terminal Vin that receives a low voltage Vss corresponding to the gate-off voltage, a pair of DC voltage terminals, e.g., a first DC voltage terminal DI1 and a second DC voltage terminal DI2, that receives the pair of DC voltages DIR and DIRB, and an output terminal OUT.

In an exemplary embodiment, the first input terminal IN1 of a stage is connected to the output terminal OUT of a previous stage to receive the gate voltage of the previous stage. However, a 0-th stage SR0 (which is a dummy stage) does not have the previous stage such that the scan start signal STVP is applied to the first input terminal IN1 thereof.

The second input terminal IN2 of the stage is connected to the output terminal OUT of a next stage to receive the gate voltage of the next stage. In such an embodiment, the (n+1)-th stage SR(n+1) (which is a dummy stage) does not have the next stage such that the scan start signal STVP is transmitted to the second input terminal IN2 thereof.

The third input terminal IN3 of the stage is connected to the output terminal OUT thereof to receive the gate voltage of the stage.

The first clock input terminal CK1 of the odd-numbered stages among the stages SR0 to SR(n+1) is applied with the first clock signal CKV, and the second input clock terminal CK2 thereof is applied with the second clock signal CKVB having an inverse phase. The first clock input terminal CK1 of the even-numbered stages among the stages SR0 to SR(n+1) is applied with the second clock signal CKVB and the second input clock terminal CK2 thereof is applied with the first clock signal CKV. In such an embodiment, the phase of the clock signal input to a clock terminal of the even-numbered stages is reversed from the phase of the clock signal input to a corresponding terminal of the odd-numbered stages. In such an embodiment, each of the first clock signal CKV and the second clock signal CKVB has a value changing every horizontal period 1H such that the first and second clock signals CKV and CKVB have 2 horizontal periods 2H as a unit period thereof and have phases inversed from each other.

The voltage input terminal Vin is applied with the low voltage Vss corresponding to the gate-off voltage, and the pair of DC voltage terminals DI1 and DI2 are applied with the pair of DC voltages DIR and DIRB. One of a pair of DC voltages DIR and DIRB is the high voltage, the other thereof is the low voltage, and the low voltage may be substantially the same as the low voltage Vss input to the voltage input terminal Vin. In one exemplary embodiment, for example, the high voltage is about 20 volts (V), and the low voltage Vss applied to one of the voltage input terminal Vin and the DC voltage terminals DI1 and DI2 is about −6 V. In an exemplary embodiment, when the gate-on voltage is sequentially applied in a forward direction (a forward direction mode), the high voltage is applied as the DIR voltage, and the low voltage Vss is applied as the DIRB voltage. In such an embodiment, when the gate-on voltage is sequentially applied in a reverse direction (a reverse direction mode), the high voltage is applied as the DIRB voltage, and the low voltage Vss is applied as the DIR voltage. In an exemplary embodiment, the forward direction mode is a mode that the gate-on voltage is sequentially applied from the first gate line G1 to the n-th gate line Gn, and the reverse direction mode is a mode that the gate-on voltage is sequentially applied from the n-th gate line Gn to the first gate line G1 in the reverse direction.

In an exemplary embodiment, the dummy stages, e.g., the 0-th stage SR0 and the (n+1)-th stage SR(n+1), are stages that generate and output the dummy gate voltage, differently from the other stages SR1 to SRn. In such an embodiment, the gate voltage output from the other stages SR1 to SRn is transmitted through the gate line, the pixel is applied with the data voltage for the image to be displayed, while the dummy stages SR0 and SR(n+1) may not be connected to the gate lines, and if they are connected to the gate lines, they are connected to the 0-th and the (n+1)-th gate lines G0 and G(n+1) of the dummy pixel (not shown) where the image is not displayed such that they are not used for the display of the image. Referring to FIG. 2, an exemplary embodiment of the gate driver 400 operates in the forward direction mode and the reverse direction mode or in bi-directional driving such that the dummy stages SR0 and SR(n+1) are positioned at the top and bottom sides.

The operation of the gate driver 400 will be described in greater detail.

Firstly, the forward direction mode will be described.

The 0-th stage SR0 receives the second clock signal CKVB through the first clock input terminal CK1 thereof, the first clock signal CKV through the second clock input terminal CK2 thereof, the scan start signal STVP through the first input terminal IN1 thereof, the low voltage Vss through the voltage input terminal Vin and the second DC voltage terminal DI2 thereof, and the high voltage through the first DC voltage terminal DI1 thereof, and outputs the gate-on voltage from the output terminal OUT thereof to the 0-th gate line G0 (the dummy gate line), the third input terminal IN3 thereof, and the first input terminal IN1 of the first stage SR1.

In the forward direction mode, the first stage SR1 receives the first clock signal CKV through the first clock input terminal CK1 thereof, the second clock signal CKVB through the second clock input terminal CK2 thereof, the gate-on voltage of the 0-th stage SR0 through the first input terminal IN1 thereof, the low voltage Vss through the voltage input terminal Vin and the second DC voltage terminal DI2 thereof, and the high voltage through the first DC voltage terminal DI1 thereof, and outputs the gate-on voltage from the output terminal OUT thereof to the first gate line G1, the third input terminal IN3 thereof, the first input terminal IN1 of the second stage SR2, and the second input terminal IN2 of the 0-th stage SR0.

In such an embodiment, the 0-th stage SR0 stops outputting the gate-on voltage through the output terminal OUT thereof in response to the gate-on voltage of the first stage SR1 applied to the second input terminal IN2 of the 0-th stage SR0.

Similarly, the n-th stage SRn receives the second clock signal CKVB through the first clock input terminal CK1 thereof, the first clock signal CKV through the second clock input terminal CK2 thereof, the gate-on voltage of the (n−1)-th stage SR(n−1) through the first input terminal IN1 thereof, the low voltage Vss through the voltage input terminal Vin and the second DC voltage terminal DI2 thereof, and the high voltage through the first DC voltage terminal DI1 thereof, and outputs the gate-on voltage from the output terminal OUT thereof to the n-th gate line Gn, the third input terminal IN3 thereof, the first input terminal IN1 of the (n+1)-th stage SR(n+1), and the second input terminal IN2 of the (n−1)-th stage SR(n−1).

Next, the (n+1)-th stage SR(n+1) receives the first clock signal CKV through the first clock input terminal CK1 thereof, the second clock signal CKVB through the second clock input terminal CK2 thereof, the gate-on voltage of the n-th stage SRn through the first input terminal IN1 thereof, the low voltage Vss through the voltage input terminal Vin and the second DC voltage terminal DI2 thereof, and the high voltage through the first DC voltage terminal DI1 thereof, and outputs the gate-on voltage from the output terminal OUT to the (n+1)-th gate line G(n+1) (the dummy gate line), the third input terminal IN3 of thereof, and the second input terminal IN2 of the n-th stage SRn.

In such an embodiment, the n-th stage SRn stops outputting the gate-on voltage through the output terminal OUT thereof in response to the gate-on voltage of the (n+1)-th stage SR(n+1) applied to the second input terminal IN2 of the n-th stage SRn.

By the above-described sequence, all gate lines G1 to Gn are sequentially applied with the gate-on voltage in the forward direction.

In an exemplary embodiment, in the reverse direction mode, the first DC voltage terminal DI1 is applied with the low voltage Vss, and the second DC voltage terminal DI2 is applied with the high voltage, differently from the forward direction mode. In the reverse direction mode, the low voltage Vss is applied as the DIR voltage and the high voltage is applied as the DIRB voltage.

In the reverse direction mode, the (n+1)-th stage SR(n+1) is firstly operated, and the 0-th stage SR0 is finally operated.

In the reverse direction mode, the (n+1)-th stage SR(n+1) receives the first clock signal CKV through the first clock input terminal CK1 thereof, the second clock signal CKVB through the second clock input terminal CK2 thereof, the scan start signal STVP through the second input terminal IN2 thereof, the low voltage Vss through the voltage input terminal Vin and the first DC voltage terminal DI1 thereof, and the high voltage through the second DC voltage terminal DI2 thereof, and outputs the gate-on voltage from the output terminal OUT thereof to the (n+1)-th gate line G(n+1) (the dummy gate line), the third input terminal IN3 thereof, and the second input terminal IN2 of the n-th stage SRn.

Next, the n-th stage SRn receives the second clock signal CKVB through the first clock input terminal CK1 thereof, the first clock signal CKV through the second clock input terminal CK2 thereof, the gate-on voltage of the (n+1)-th stage SR(n+1) through the second input terminal IN2, the low voltage Vss through the voltage input terminal Vin and the first DC voltage terminal DI1 thereof, and the high voltage through the second DC voltage terminal DI2 thereof, and outputs the gate-on voltage from the output terminal OUT thereof to the n-th gate line Gn, the third input terminal IN3 thereof, the first input terminal IN1 of the (n+1)-th stage SR(n+1), and the second input terminal IN2 of the (n−1)-th stage SR(n−1).

In such an embodiment, the (n+1)-th stage SR(n+1) stops outputting the gate-on voltage through the output terminal OUT thereof in response to the gate-on voltage of the n-th stage SRn applied to the first input terminal IN1 of the (n+1)-th stage SR(n+1).

Similarly, the first stage SR1 receives the first clock signal CKV through the first clock input terminal CK1 thereof, the second clock signal CKVB through the second clock input terminal CK2 thereof, the gate-on voltage of the second stage SR2 through the second input terminal IN2 thereof, the low voltage Vss through the voltage input terminal Vin and the first DC voltage terminal DI1 thereof, and the high voltage through the second DC voltage terminal DI2 thereof, and outputs the gate-on voltage from the output terminal OUT thereof to the first gate line G1, the third input terminal IN3 thereof, the first input terminal IN1 of the second stage SR2, and the second input terminal IN2 of the 0-th stage SR0.

Next, the 0-th stage SR0 receives the second clock signal CKVB through the first clock input terminal CK1 thereof, the first clock signal CKV through the second clock input terminal CK2 thereof, the gate-on voltage of the first stage SR1 through the second input terminal IN2 thereof, the low voltage Vss through the voltage input terminal Vin and the first DC voltage terminal DI1 thereof, and the high voltage through the second DC voltage terminal DI2 thereof, and outputs the gate-on voltage from the output terminal OUT thereof to the 0-th gate line G0 (the dummy gate line), the third input terminal IN3 thereof, and the first input terminal IN1 of the first stage SR1.

In such an embodiment, the first stage SR1 stops outputting the gate-on voltage through the output terminal OUT thereof in response to the gate-on voltage of the 0-th stage SR0 applied to the first input terminal IN1 of the first stage SR1.

By the above sequence, all gate lines G1 to Gn are sequentially applied with the gate-on voltage in the reverse direction.

Hereinafter, one stage connected to one gate line will be described in greater detail with reference to FIG. 3.

Figure 3:
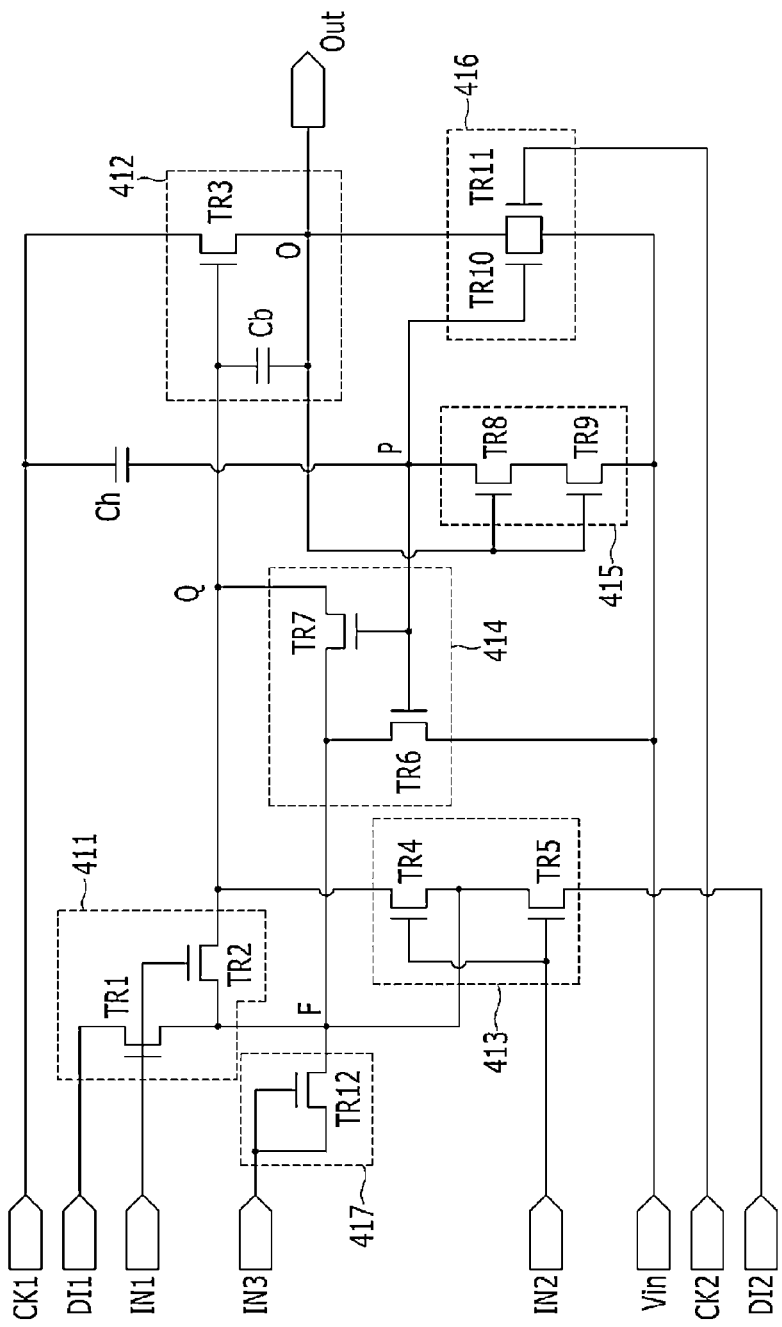
FIG. 3 is a circuit diagram showing an exemplary embodiment of a stage according to the invention.

FIG. 3 is a circuit diagram showing an exemplary embodiment of a stage according to the invention.

Referring to FIG. 3, a stage of the gate driver 400 includes a pull-up driver 412, an output pull-down unit 416, a reset unit 415, a first node pull-up unit 411 (also referred to as a node Q pull-up unit), a first node pull-down unit 414 (also referred to as a node Q pull-down unit), a first node reset unit 413 (also referred to as a node Q reset unit) and a floating node stabilization unit 417.

Referring to FIG. 3, an exemplary embodiment in which a DC of the high voltage is applied to the DIR voltage and the DC of the low voltage (the Vss voltage) is applied to the DIRB voltage in the forward direction mode will be described. In the reverse direction mode, the terms and the operations may be different.

The pull-up driver 412 of the stage is a unit that generates and outputs the gate-on voltage. The pull-up driver 412 is connected to the output terminal OUT, a first node of the stage (e.g., the node Q in FIG. 3) and the first clock input terminal CK1, and includes a transistor TR3 and a capacitor Cb. A fourth node of the stage (e.g., the node O in FIG. 3) is positioned inside the pull-up driver 412 and is connected to the output terminal OUT. The transistor TR3 of the pull-up driver 412 includes a control terminal connected to the node Q, an input terminal connected to the first clock input terminal CK1, and an output terminal connected to the output terminal OUT of the stage. The capacitor Cb of the pull-up driver 412 includes an output terminal connected to the control terminal of the transistor TR3 of the pull-up driver 412, such that the voltage of the node Q is stored. When the clock signal is changed from a low value to a high value through the first clock input terminal CK1 in a state where the node Q is applied with the gate-on voltage such that the capacitor Cb of the pull-up driver 412 stores the high voltage, the voltage at the node O as the output terminal of the transistor TR3 of the pull-up driver 412 is boosted such that the gate-on voltage is generated and output through the output terminal OUT of the stage.

The output pull-down unit 416 is connected to the output terminal OUT of the stage, such that the output pull-down unit 416 functions to change the voltage of the node O into the low voltage Vss. The output pull-down unit 416 is connected to the node O, a second node of the stage (e.g., the node P in FIG. 3), the voltage input terminal Vin and the second clock input terminal CK2, and includes a first transistor TR10 and a second transistor TR11. The first transistor TR10 of the output pull-down unit 416 includes a control terminal connected to the node P, an input terminal connected to the node O, and an output terminal connected to the voltage input terminal Vin. The second transistor TR11 of the output pull-down unit 416 includes a control terminal connected to the second clock input terminal CK2, an input terminal connected to the node O, and an output terminal connected to the voltage input terminal Vin. The clock signal input from the second clock input terminal CK2 has a phase reversed from a phase of the clock signal input from the first clock input terminal CK1 such that the second transistor TR11 of the output pull-down unit 416 is turned on at the passage of the horizontal period 1H after the gate-on voltage is output and the voltage of the node O is output through the second transistor TR11 of the output pull-down unit 416 and is changed into the low voltage Vss, and the gate-on output is thereby stopped. In such an embodiment, the voltage of the node P is the voltage that the clock signal input to the first clock input terminal CK1 is passed and transmitted through a capacitor Ch connected between the first clock input terminal CK1 and the note P and changed based on the clock signal, and the low voltage Vss is maintained during a time when the gate-on voltage is output in the stage. The operation of the reset unit 415 will now be described.

The reset unit 415 changes the voltage of the node P into the low voltage Vss during a time when the gate-on voltage is output through the node O such that a first and second transistors TR6 and TR7 of the node Q pull-down unit 414 and the first transistor TR10 of the output pull-down unit 416 stop operating. The reset unit 415 is connected to the voltage input terminal Vin, the node P and the node O, and includes a first transistor TR8 and a second transistor TR9. The first transistor TR8 of the reset unit 415 includes a control terminal connected to the node O, an input terminal connected to the node P, and an output terminal connected to the input terminal of the second transistor TR9 of the reset unit 415. The second transistor TR9 of the reset unit 415 includes a control terminal connected to the node O, an input terminal connected to the output terminal of the first transistor TR8 of the reset unit 415, and an output terminal connected to the voltage input terminal Vin. In such an embodiment, the control terminals of the first and second transistors TR8 and TR9 of the reset unit 415 are both connected to the node O such that the control node of the reset unit 415 is the node O.

Next, operation of the node Q pull-up unit 411, the node Q pull-down unit 414 and the node Q reset unit 413, which are related to the node Q, will be described.

The node Q pull-up unit 411 functions to increase the voltage of the node Q (the control terminal of the transistor TR3 of the pull-up driver 412 of the stage) to the DIR voltage (e.g., the high voltage). The node Q pull-up unit 411 is connected to the first DC voltage terminal DI1, the first input terminal IN1, the node Q and a third node of the stage (e.g., the node F in FIG. 3), and includes a first transistor TR1 and a second transistor TR2. The first transistor TR1 of the node Q pull-up unit 411 includes a control terminal connected to the first input terminal IN1, an input terminal connected to the first DC voltage terminal DI1, and an output terminal connected to the node F. The second transistor TR2 of the node Q pull-up unit 411 includes a control terminal connected to the first input terminal IN1, an input terminal connected to the output terminal of the first transistor TR1 of the node Q pull-up unit 411, that is, the node F, and an output terminal connected to the node Q. When the gate-on voltage of a previous stage of the stage is transmitted to the first input terminal IN1, the node Q pull-up unit 411 applies the gate-on voltage to the control terminals of the first and second transistors TR1 and TR2 of the node Q pull-up unit 411, and the DIR voltage (high voltage) is transmitted to the node Q through the first and second transistors TR1 and TR2 of the node Q pull-up unit 411 such that the voltage of the node Q is pulled up to the high voltage. Also, the output terminal of the first transistor TR1 of the node Q pull-up unit 411 also transmits the DIR voltage (high voltage) to the node F (floating node).

The node Q pull-down unit 414 functions to decrease the voltage of the node Q to the low voltage Vss corresponding to the gate-off voltage. The node Q pull-down unit 414 is connected to the node Q, the node F, the node P and the voltage input terminal Vin, and includes a first transistor TR6 and a second transistor TR7. The first transistor TR6 of the node Q pull-down unit 414 includes a control terminal connected to the node F, an input terminal connected to the voltage input terminal Vin. The second transistor TR7 of the node Q pull-down unit 414 includes a control terminal connected to the node P, an input terminal connected to the node Q, and an output terminal connected to the input terminal of the first transistor TR6 of the node Q pull-down unit 414, that is, the node F. When the voltage of the node P is the high voltage, the node Q pull-down unit 414 discharges the voltage of the node Q to the low voltage Vss through the first and second transistors TR6 and TR7 of the node Q pull-down unit 414. In such an embodiment, the voltage of the node P is the node that the clock signal input to the first clock input terminal CK1 is transmitted through the capacitor Ch connected between the first clock input terminal CK1 and the note P and is periodically changed based on the clock signal, while the low voltage Vss of the node Q is maintained during a time when the gate-on voltage is output in the stage. Also, the node P is the node that operates the first transistor TR10 of the output pull-down unit 416 such that the first and second transistors TR6 and TR7 of the node Q pull-down unit 414 and the first transistor of TR10 of the output pull-down unit 416 are operated together.

When the gate-on voltage of the next stage SR is applied, the node Q reset unit 413 functions to decrease the voltage of the node Q to the DIRB voltage (low voltage Vss). The node Q reset unit 413 is connected to the second input terminal IN2, the second DC voltage terminal DI2, the node Q and the node F, and includes a first transistor TR4 and a second transistor TR5. The first transistor TR4 of the node Q reset unit 413 includes a control terminal connected to the second input terminal IN2, an input terminal connected to the node Q, and an output terminal connected to the node F. The second transistor TR5 of the node Q reset unit 413 includes a control terminal connected to the second input terminal IN2, an input terminal connected to the output terminal of the first transistor TR4 of the node Q reset unit 413, that is, the node F, and an output terminal connected to the second DC voltage terminal DI2. When the gate-on voltage of the next stage is applied through the second input terminal IN2, the first and second transistors TR4 and TR5 of the node Q reset unit 413 are turned on such that the voltage of the node Q is decreased to the low voltage Vss and the pull-up driver 412 does not further output the gate-on voltage.

The node Q pull-down unit 414 and the node Q reset unit 413 have functions substantially similar to each other, while driving timings of the node Q pull-down unit 414 and the node Q reset unit 413 are different from each other. In the reverse direction mode, the functions of the node Q reset unit 413 and the node Q pull-up unit 411 are exchanged. The reverse direction mode will be described later in detail.

In an exemplary embodiment, the floating node stabilization unit 417 stabilizes the voltage of the stage when the node F (floating node) is floated during a time when the stage is operated such that the voltage is unstable. In such an embodiment, the node F is applied with the gate-on voltage of the next stage through the second input terminal IN2 after the gate-on voltage of the previous stage is applied through the first input terminal IN1, and at this time, the node F is floated during a time when the gate-on voltage is applied in the stage between the previous stage and the next stage. Accordingly, the gate-on voltage of the current stage is applied to the node F through the floating node stabilization unit 417 for stabilization. The floating node stabilization unit 417 is connected to the third input terminal IN3 and the node F, and includes a transistor TR12. The transistor TR12 of the floating node stabilization unit 417 is diode-connected and includes a control terminal and an input terminal connected to the third input terminal IN3, and an output terminal connected to the node F. In an exemplary embodiment, when the gate-on voltage is input through the third input terminal IN3, the gate-on voltage is transmitted to the node F through the diode-connected transistor TR12 such that the voltage of the node F is maintained as the gate-on voltage and is substantially stable.

In an exemplary embodiment, the stage includes the capacitor Ch connected to the node P and the first clock input terminal CK1. The capacitor Ch connected to the node P and the first clock input terminal CK1 effectively prevents the clock signal input to the first clock input terminal CK1 from being directly transmitted to the node P.

One stage has been described with reference to the operation in the forward direction mode above. Next, the operation in the reverse direction mode will be described.

In the reverse direction mode, the low voltage Vss is applied through the first DC voltage terminal DI1, and the high voltage is applied through the second DC voltage terminal DI2. The stage generates and outputs the gate-on voltage by the gate-on voltage transmitted through the second input terminal IN2, and the stage does not output the gate-on voltage by the gate-on voltage input through the first input terminal IN1. In such an embodiment, the functions and operations of the node Q pull-up unit 411 and the node Q reset unit 413 are exchanged, and the structures of the transistors in the node Q pull-up unit 411 and the node Q reset unit 413 are substantially identical to each other for this operation exchange. That is, both of the node Q pull-up unit 411 and the node Q reset unit 413 are operated by the gate-on voltage (input from the first input terminal IN1 or the second input terminal IN2) applied in other stages, and thereby the voltage of the node Q functions as the DC voltage (input from the first DC voltage terminal DI1 or the second DC voltage terminal DI2).

In an exemplary embodiment, the gate driver 400 having the structure of FIGS. 2 and 3 may be operated in the reverse direction mode by the change of the voltage applied to the first DC voltage terminal DI1 and the second DC voltage terminal DI2.

According to the illustrated exemplary embodiment of FIG. 3, the control node of the reset unit 415 is the node O. In an alternative exemplary embodiment, the control node of the reset unit 415 may be the node Q.

The voltage waveform of the node O and the node Q will be described with reference to FIGS. 4 and 5.

Figure 4:
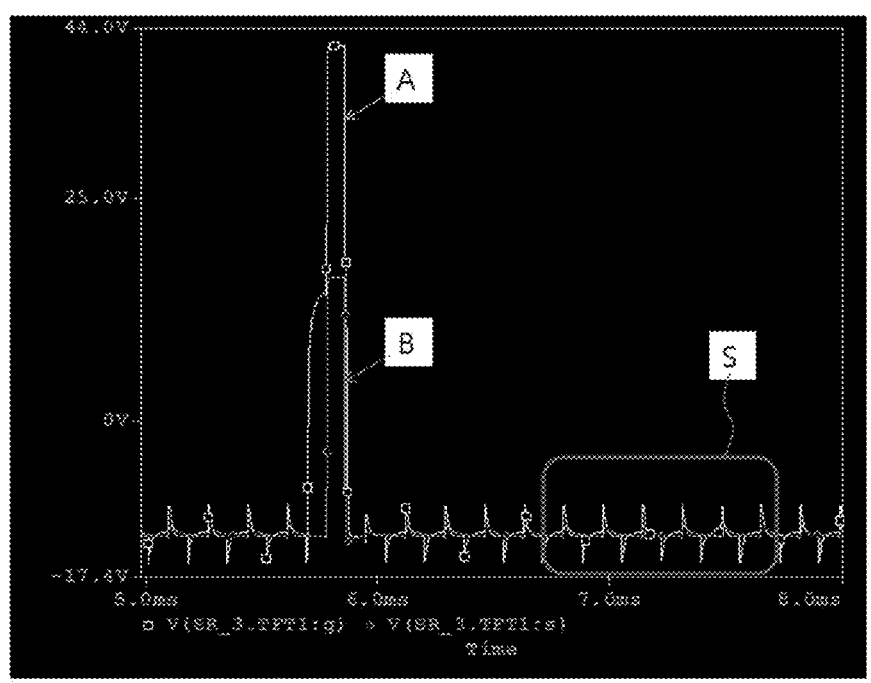
FIGS. 4 and 5 are waveform diagrams showing voltages measured at the node Q and the node O of the stage of FIG. 3.
Figure 5:
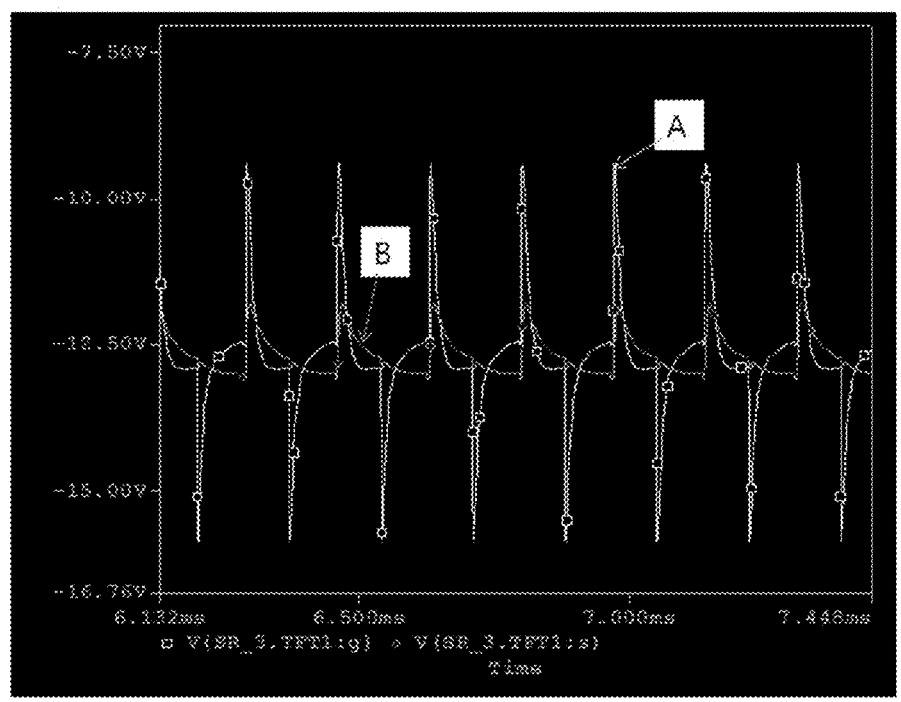

FIGS. 4 and 5 are waveform diagrams showing a voltage measured at the node Q and the node O of the stage of FIG. 3.

A waveform A of FIGS. 4 and 5 is a waveform measuring the voltage at the node Q, and a waveform B is a waveform measuring the voltage at the node O. Also, FIG. 5 is an enlarged view of a portion S of FIG. 4.

Referring to FIGS. 4 and 5, the voltage of the node Q has a value greater than the voltage of the node O, and thus a ripple of the node Q may be greater than a ripple in the node O.

Figure 6:
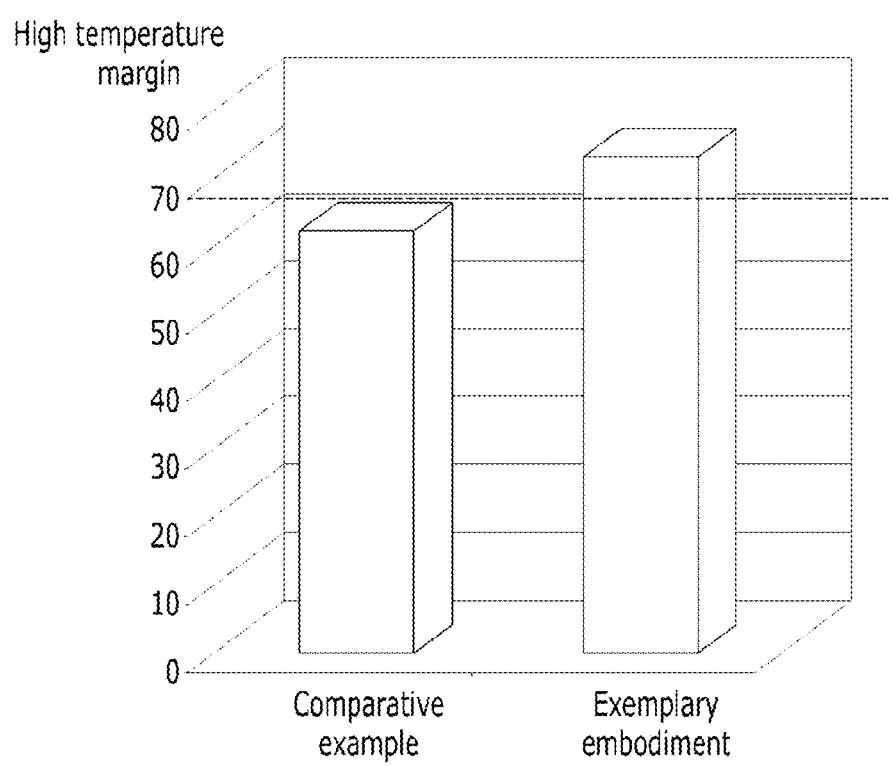
FIG. 6 is a graph showing a high temperature margin of the exemplary embodiment of FIG. 3.

In an exemplary embodiment where the node Q is used as the control node of the reset unit 415, a current leak in the first and second transistors TR8 and TR9 of the reset unit 415 may be greater than a current leak in the first and second transistors TR8 and TR9 of the reset unit 415 in an exemplary embodiment where the node O is used as the control node. In such an embodiment, the leakage current increases when the control voltage increases based on the characteristic of the thin film transistor. As a result, when the node Q is used as the control node of the reset unit 415, the voltage of the node P is leaked such that the node Q pull-down unit 414 and the first transistor TR10 of the output pull-down unit 416 may not effectively operate. Accordingly, the gate-on voltage may not be off substantially at appropriate time, which may occur when the gate driver 400 is particularly operated at a high temperature. FIG. 6 shows a high temperature margin.

FIG. 6 is a graph showing a high temperature margin of the exemplary embodiment of FIG. 3.

The exemplary embodiment in FIG. 6 represents the illustrated exemplary embodiment of FIG. 3 where the node O is used as the control node of the reset unit 415, and the comparative example represents an embodiment where the node Q is used as the control node of the reset unit 415, differently from the illustrated exemplary embodiment in FIG. 3. Also, in FIG. 6, a value of 70 points is regarded as a margin point for a normal operation of the gate driver at a high temperature.

As shown in FIG. 6, in a comparative example where the node Q is used as the control node of the reset unit 415, the high temperature margin of 62 points is calculated such that the gate driver may not substantially normally operate at the high temperature. However, the exemplary embodiment of FIG. 3 where the node O is used as the control node of the reset unit 415, the high temperature margin is calculated as 73 points such that the gate driver may operate substantially normally at a high temperature. In an exemplary embodiment where the control node of the reset unit 415 is the node O, the high temperature margin may increase by 17%.

Next, alternative exemplary embodiments of the invention will be described with reference to FIGS. 7 to 9.

Figure 7:
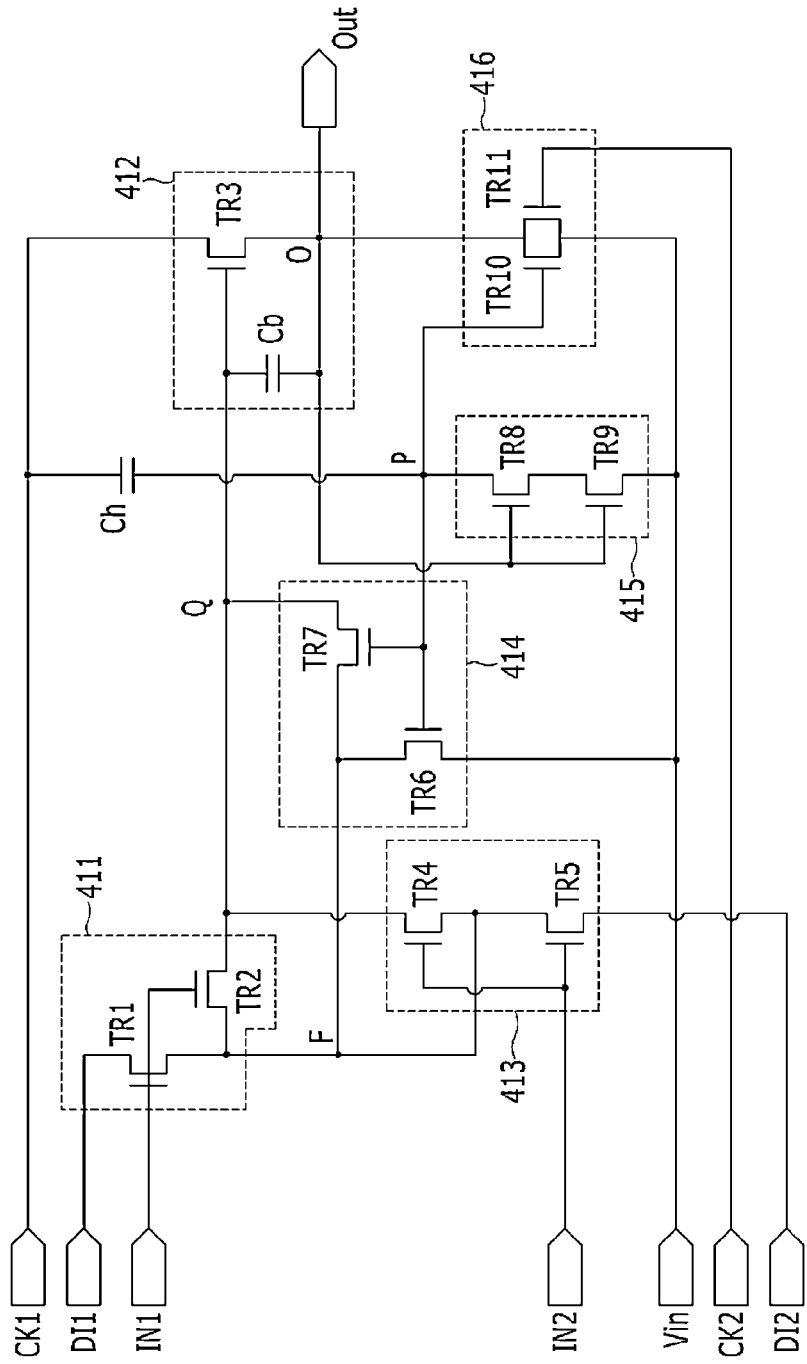
FIGS. 7 to 9 are circuit diagrams showing alternative exemplary embodiments of the stage according to the invention.
Figure 8:
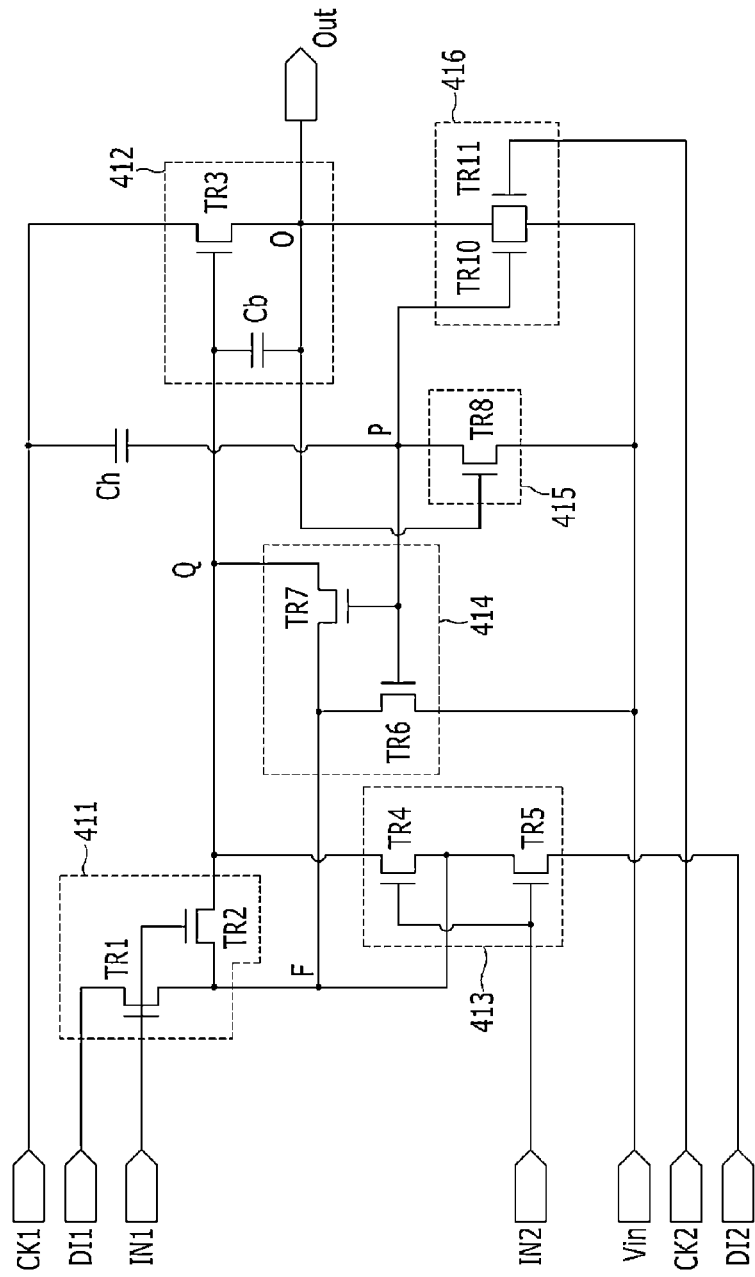
Figure 9:
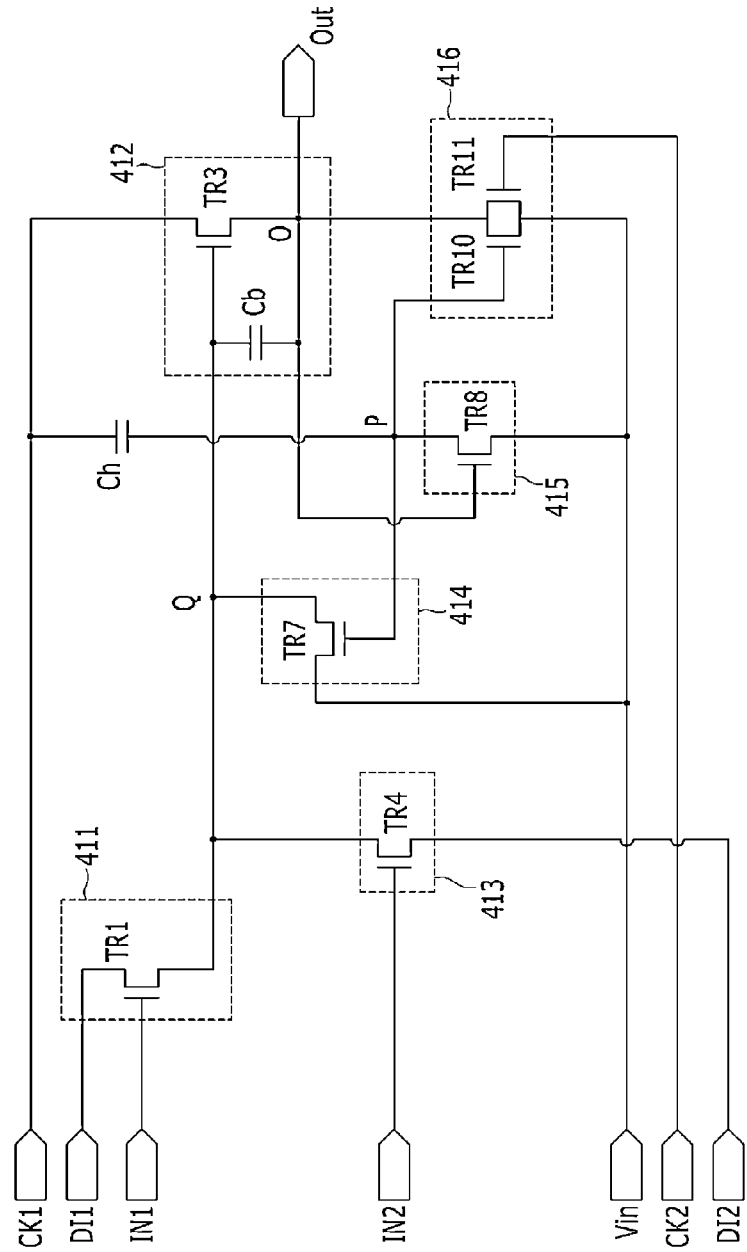

FIGS. 7 to 9 are circuit diagrams showing alternative exemplary embodiments of the stage according to the invention.

In an alternative exemplary embodiment, as shown in the stage of FIG. 7, a floating node stabilization unit 417 may be omitted, differently from the exemplary embodiment of FIG. 3. The floating node stabilization unit 417 applies the gate-on voltage to the node F during the time when the stage is operated such what the stage operates substantially stably based on the gate-on voltage. In the illustrated exemplary embodiment of FIG. 7, the floating node stabilization unit 417 may be omitted since the floating node stabilization unit 417 may stabilize the stage only for the horizontal period 1H. In an exemplary embodiment where the floating node stabilization unit 417 is omitted, the area of the gate driver 400 to be integrated with the display panel 100 may be substantially reduced such that spare space may be substantially ensured in the display panel 100 or the area of the non-display area may be substantially reduced.

In another alternative exemplary embodiment, as shown in the stage of FIG. 8, one of the two transistors of the reset unit 415 and the floating node stabilization unit 417 are omitted. In the illustrated exemplary embodiment of FIG. 8, the reset unit 415 includes only the first transistor TR8, and the first transistor TR8 includes the control terminal connected to the node O (output terminal OUT), the input terminal connected to the node P, and the output terminal connected to the voltage input terminal Vin.

As shown in the structure of the reset unit 415 of FIG. 3, two transistors, e.g., the first and second transistors TR8 and TR9 of the reset unit 415 include the input terminal as the node P, the output terminal connected as the voltage input terminal Vin, and the control terminal connected to the node O. Therefore, the two transistors TR8 and TR9 operate together, and the voltage of the node P is thereby changed to the low voltage Vss such that only one transistor TR8 (referring to FIG. 8) may be used. In the exemplary embodiment of FIG. 8, where only the first transistor TR8 is used in the reset unit 415, the area of the gate driver 400 may be substantially reduced and the characteristic of the gate driver 400 may be substantially improved at the low temperature. In an exemplary embodiment where the gate driver 400 is integrated with the display panel 100, the semiconductor that forms the channel of the transistor included in the gate driver 400 has a characteristic which changes under the temperature such that the gate driver 400 may not normally operate. An exemplary embodiment of the gate driver 400, which may not normally operate at a high temperature, may normally operate at a low temperature, but the operation speed of the transistor included in the gate driver may be deteriorated at the low temperature. In the illustrated exemplary embodiment of FIG. 3, where the reset unit 415 includes the two transistors TR8 and TR9, the voltage of the node P may pass through the channel of the first transistor TR8 and then through the channel of the second transistor TR9 to discharge the voltage from the side of the voltage input terminal Vin. At the low temperature, an amount of time for the passage through the channel of a transistor is substantially increased such that the time for the voltage of the node P to be changed to the low voltage Vss is substantially increased, and thus the stage may not normally operate. Therefore, in an exemplary embodiment shown in FIG. 8, the reset unit 415 includes only one transistor, e.g., the first transistor TR8, and the time for changing the voltage of the node P to the low voltage Vss is substantially reduced at the low temperature such that the operation of the stage may be normal.

In another alternative exemplary embodiment of the stage, as shown in FIG. 9, the floating node stabilization unit 417 is omitted, and all of the reset unit 415, the node Q pull-up unit 411, the node Q pull-down unit 414, and the node Q reset unit 413 includes only one transistor.

In the exemplary embodiment shown in FIG. 3, the node Q pull-up unit 411 and the node Q reset unit 413 include two transistors having the control terminal connected to the same terminal to change the node Q into the high voltage or the low voltage Vss such that one of the two transistors may be omitted without error. In an exemplary embodiment, where the node Q pull-up unit 411 and the node Q reset unit 413 include only one transistor, the node F does not exist and the floating node stabilization unit 417 is also omitted. In the exemplary embodiment of FIG. 9, the node Q pull-up unit 411 includes the first transistor TR1, and a transistor, e.g., the first transistor TR1 of the node Q pull-up unit 411 includes the control terminal connected to the first input terminal IN1, the input terminal connected to the first DC voltage terminal DI1, and the output terminal connected to the node Q. In such an embodiment, the node Q reset unit 413 includes a transistor, e.g., the first transistor TR4, and the first transistor TR4 of the node Q reset unit 413 includes the control terminal connected to the second input terminal IN2, the input terminal connected to the node Q, and the output terminal connected to the second DC voltage terminal DI2.

The node Q pull-down unit 414 includes one transistor, e.g., the second transistor TR7 thereof. The node Q pull-down unit 414 changes the voltage of the node Q into the low voltage Vss based on the voltage of the node P such that one of the two transistors including the control terminals connected to the same node P may be omitted. As shown in FIG. 9, the node Q pull-down unit 414 may include only the second transistor TR7 including the control terminal connected to the node P, the input terminal connected to the node Q, and the output terminal connected to the voltage input terminal Vin.

In an exemplary embodiment of the stage, as shown in FIG. 9, the number of transistors in the stage is substantially reduced, the integration area of the gate driver 400 may be substantially reduced, and the error at the low temperature may be effectively prevented.

The gate driver 400 integrated with the display panel 100 is provided along with a pixel PX in the display area 300. The semiconductor of the transistor inside the integrated gate driver 400 may be an amorphous semiconductor or a polycrystalline semiconductor, and uses the same material as the semiconductor used in the switching element of the pixel PX. However, the amorphous semiconductor has a characteristic that substantially changes according to temperature than that of the polycrystalline semiconductor such that the amorphous semiconductor is sensitive with regard to the temperature characteristic. In exemplary embodiments of the invention, the transistor may include the amorphous semiconductor or the polycrystalline semiconductor, and the abnormal operation is effectively prevented at the high temperature or the low temperature when the amorphous semiconductor is used.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display panel comprising:
a plurality of gate lines;
a plurality of data lines crossing the plurality of gate lines;
a plurality of pixels connected to the plurality of gate lines and the plurality of data lines; and
a plurality of stages respectively connected to the plurality of gate lines and an integrated gate driver,
wherein each of the plurality of stages comprises:
a first node;
a second node;
a pull-up driver including an output terminal of the each of the plurality of stages, connected to the first node, and which outputs a gate-on voltage;
an output pull-down unit connected to the second node and which pulls down the output terminal of the each of the plurality of stages, the output pull-down unit having a first transistor including a control terminal directly connected to the second node, an input terminal connected to the output terminal of the each of the plurality of stages, and an output terminal connected to a voltage input terminal of the each of the plurality of stages to receive a low voltage;
a reset unit connected to the second node and which changes a voltage of the second node into a low voltage based on a voltage of the output terminal of the each of the plurality of stages;
a first node pull-up unit connected to the first node and which changes the first node into a high voltage based on a gate-on voltage output from a previous stage of the each of the plurality of stages;
a first node pull-down unit which is connected to the first node and the second node and changes the voltage of the first node into the low voltage based on the voltage of the second node, the first node pull-down unit having two transistors each having a control terminal directly connected to the second node, an input terminal of one of the two transistors is directly connected to an output terminal of the other of the two transistors, and a first node reset unit connected to the first node and which changes the voltage of the first node into the low voltage based on the gate-on voltage output from a subsequent stage of the each of the plurality of stages, wherein the first transistor of the output pull-down unit is different from the two transistors of the first node pull-down unit.

2. The display panel of claim 1, wherein the reset unit comprises a first transistor and a second transistor, the first transistor of the reset unit includes a control terminal connected to the output terminal of the each of the plurality of stages, an input terminal connected to the second node, and an output terminal connected to the second transistor of the reset unit, and the second transistor includes a control terminal connected to the output terminal of the each of the plurality of stages, an input terminal connected to the first transistor of the reset unit, and an output terminal connected to a voltage input terminal of the each of the plurality of stages to receive a low voltage.

3. The display panel of claim 1, wherein the reset unit comprises a transistor, and the transistor of the reset unit includes a control terminal connected to the output terminal of the pull-up driver, an input terminal connected to the second node, and an output terminal connected to a voltage input terminal of the each of the plurality of stages to receive a low voltage.

4. The display panel of claim 1, wherein the pull-up driver comprises a transistor and a capacitor, the transistor of the pull-up driver includes a control terminal connected to the first node, an input terminal connected to a first clock input terminal of the each of the plurality of stages, and an output terminal connected to the output terminal of the each of the plurality of stages, and the capacitor of the pull-up driver is connected to the control terminal and the output terminal of the transistor of the pull-up driver.

5. The display panel of claim 4, wherein the output pull-down unit further comprises a second transistor, the second transistor of the output pull-down unit includes a control terminal connected to a second clock input terminal, an input terminal connected to the output terminal of the each of the plurality of stages, and an output terminal connected to the voltage input terminal of the each of the plurality of stages to receive a low voltage.

6. The display panel of claim 5, wherein the first node pull-up unit comprises a first transistor and a second transistor, the first node reset unit comprises a first transistor and a second transistor, the first transistor of the first node pull-up unit includes a control terminal connected to a first input terminal of the each of the plurality of stages, an input terminal connected to a first direct current (DC) voltage terminal of the each of the plurality of stages, and an output terminal connected to a third node of the each of the plurality of stages, the second transistor of the first node pull-up unit includes a control terminal connected to the first input terminal of the each of the plurality of stages, an input terminal connected to an output terminal of the first transistor of the first node pull-up unit, and an output terminal connected to the first node, the first transistor of the first node reset unit includes a control terminal connected to a second input terminal of the each of the plurality of stages, an input terminal connected to the first node, and an output terminal connected to the third node, and the second transistor of the first node reset unit includes a control terminal connected to the second input terminal of the each of the plurality of stages, an input terminal connected to an output terminal of the first transistor of the first node reset unit, and an output terminal connected to a second DC voltage terminal of the each of the plurality of stages.

7. The display panel of claim 6, wherein the first node pull-down unit comprises a first transistor and a second transistor, the first transistor of the first node pull-down unit includes a control terminal connected to the second node, an input terminal connected to the third node, and an output terminal connected to a voltage input terminal to receive a low voltage, and the second transistor of the first node pull-down unit includes a control terminal connected to the second node, an input terminal connected to the first node, and an output terminal connected to the input terminal of the first transistor of the first node pull-down unit.

8. The display panel of claim 5, wherein the first node pull-up unit comprises a transistor, the first node reset unit comprises a transistor, the transistor of the first node pull-up unit includes a control terminal connected to the first input terminal, an input terminal connected to a first DC voltage terminal, and an output terminal connected to the first node, and the transistor of the first node reset unit includes a control terminal connected to the second input terminal, an input terminal connected to the first node, and an output terminal connected to a second DC voltage terminal.

9. The display panel of claim 8, wherein the first node pull-down unit comprises a transistor, and the transistor of the first node pull-down unit includes a control terminal connected to the second node, an input terminal connected to the first node and an output terminal connected to the voltage input terminal to receive a low voltage.

10. The display panel of claim 1, wherein the each of the plurality of stages further comprises a floating node stabilization unit which transmits a gate-on voltage to a third node of the each of the plurality of stages, and the third node is connected to the floating node stabilization unit, the first node pull-up unit, the first node reset unit and the first node pull-down unit.

11. The display panel of claim 1, wherein the each of the plurality of stages includes a first DC voltage terminal which is applied with the high voltage and a second DC voltage terminal which is applied with the low voltage in a forward direction mode, the first DC voltage terminal is connected to the first node pull-up unit, and the second DC voltage terminal is connected to the first node reset unit.

12. The display panel of claim 11, wherein the first DC voltage terminal is applied with the low voltage and the second DC voltage terminal is applied with the high voltage in a reverse direction mode, an operation of the first node pull-up unit in the reverse direction mode is substantially the same as an operation of the first node reset unit in the forward direction mode, and an operation of the first node reset unit in the reverse direction mode is substantially the same as an operation of the first node pull-up unit in the forward direction mode.

13. A driving apparatus integrated with a display panel, comprising:

a gate driver comprising a plurality of stages which transmits a gate-on voltage to a plurality of gate lines, wherein each of the plurality of stages comprises:

a first node;

a second node;

a pull-up driver including an output terminal of the each of the plurality of stages, connected to the first node, and which outputs a gate-on voltage;

an output pull-down unit connected to the second node and which pulls down the output terminal of the each of the plurality of stages, the output pull-down unit having a first transistor including a control terminal directly connected to the second node, an input terminal connected to the output terminal of the each of the plurality of stages, and an output terminal connected to a voltage input terminal of the each of the plurality of stages to receive a low voltage;

a reset unit connected to the second node and which changes a voltage of the second node into a low voltage based on a voltage of the output terminal of the each of the plurality of stages;

a first node pull-up unit connected to the first node and which changes the first node into a high voltage based on a gate-on voltage output from a previous stage of the each of the plurality of stages;

a first node pull-down unit which is connected to the first node and the second node and changes the voltage of the first node into a low voltage based on the voltage of the second node, the first node pull-down unit having two transistors each having a control terminal directly connected to the second node, an input terminal of one of the two transistors is directly connected to an output terminal of the other of the two transistors; and a first node reset unit connected to the first node and which changes the voltage of the first node into a low voltage based on the gate-on voltage output from a subsequent stage of the each of the plurality of stages, wherein the first transistor of the output pull-down unit is different from the two transistors of the first node pull-down unit.

14. The driving apparatus of claim 13, wherein the reset unit comprises a first transistor and a second transistor, the first transistor of the reset unit includes a control terminal connected to the output terminal of the pull-up driver, an input terminal connected to the second node, and an output terminal connected to the second transistor of the reset unit, and the second transistor of the rest unit includes a control terminal connected to the output terminal of the pull-up driver, an input terminal connected to the first transistor of the reset unit, and an output terminal connected to a voltage input terminal to receive a low voltage.

15. The driving apparatus of claim 13, wherein the reset unit comprises a transistor, and the transistor of the reset unit includes a control terminal connected to an output terminal, an input terminal connected to the second node, and the output terminal connected to a voltage input terminal to receive a low voltage.

16. The driving apparatus of claim 13, wherein the first node pull-up unit comprises a first transistor and a second transistor, the first node reset unit comprises a first transistor and a second transistor, the first transistor of the first node pull-up unit includes a control terminal connected to a first input terminal, an input terminal connected to a first DC voltage terminal, and an output terminal connected to a third node of the each of the plurality of stages, the second transistor of the first node pull-up unit includes a control terminal connected to the first input terminal, an input terminal connected an output terminal of the first transistor of the first node pull-up unit, and an output terminal connected to the first node, the first transistor of the first node rest unit includes a control terminal connected to a second input terminal, an input terminal connected to the first node, and an output terminal connected to the third node, and the second transistor of the first node reset unit includes a control terminal connected to the second input terminal, an input terminal connected to an output terminal of the first transistor of the first node rest unit, and the output terminal connected to a second DC voltage terminal.

17. The driving apparatus of claim 16, wherein the first node pull-down unit comprises a first transistor and a second transistor, the first transistor of the first node pull-down unit includes a control terminal connected to the second node, an input terminal connected to the third node, and an output terminal connected to a voltage input terminal to receive a low voltage, and the second transistor of the first node pull-down unit includes a control terminal connected to the second node, an input terminal connected to the first node, and an output terminal connected to the input terminal of the first transistor of the first node pull-down unit.

18. The driving apparatus of claim 13, wherein the first node pull-up unit comprises a transistor, the first node reset unit comprises a transistor, the transistor of the first node pull-up unit includes a control terminal connected to a first input terminal, an input terminal connected to a first DC voltage terminal, and an output terminal connected to the first node, and the transistor of the first node reset unit includes a control terminal connected to a second input terminal, an input terminal connected to the first node, and an output terminal connected to a second DC voltage terminal.

19. The driving apparatus of claim 18, wherein the first node pull-down unit comprises a transistor, and the transistor of the first node pull-down unit includes a control terminal connected to the second node, an input terminal connected to the first node, and an output terminal connected to a voltage input terminal to receive a low voltage.

20. The driving apparatus of claim 13, wherein the each of the plurality of stages further comprises a floating node stabilization unit which transmits a gate-on voltage to a third node of the each of the plurality of stages, and the third node is connected to the floating node stabilization unit, the first node pull-up unit, the first node reset unit and the first node pull-down unit.

* * * * *